United States Patent
Matsudai et al.

(10) Patent No.: US 9,324,816 B2
(45) Date of Patent: *Apr. 26, 2016

(54) SEMICONDUCTOR DEVICE

(71) Applicant: Kabushiki Kaisha Toshiba, Minato-ku, Tokyo (JP)

(72) Inventors: Tomoko Matsudai, Shibuya Tokyo (JP); Yuuichi Oshino, Fuchu Tokyo (JP); Bungo Tanaka, Ageo Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/641,137

(22) Filed: Mar. 6, 2015

(65) Prior Publication Data

US 2016/0035840 A1 Feb. 4, 2016

(30) Foreign Application Priority Data

Aug. 4, 2014 (JP) ................................ 2014-158930

(51) Int. Cl.
*H01L 29/78* (2006.01)
*H01L 29/40* (2006.01)
*H01L 29/739* (2006.01)
*H01L 29/423* (2006.01)

(52) U.S. Cl.
CPC .......... *H01L 29/404* (2013.01); *H01L 29/4236* (2013.01); *H01L 29/7397* (2013.01)

(58) Field of Classification Search
CPC ....... H01L 29/40; H01L 29/78; H01L 29/872; H01L 29/7786
USPC .................................................. 257/139, 618
See application file for complete search history.

(56) References Cited

U.S. PATENT DOCUMENTS

| | | | |
|---|---|---|---|
| 6,064,103 A | 5/2000 | Pfirsch | |
| 7,233,031 B2 | 6/2007 | Mauder et al. | |
| 7,750,428 B2 | 7/2010 | Hirler et al. | |
| 2012/0218796 A1* | 8/2012 | Okamoto | H01L 29/0615 363/126 |
| 2013/0037851 A1 | 2/2013 | Gejo | |
| 2013/0056744 A1* | 3/2013 | Mishra | H01L 29/0619 257/76 |
| 2013/0181328 A1* | 7/2013 | Cao | H01L 29/0657 257/618 |
| 2014/0077261 A1 | 3/2014 | Oshino et al. | |
| 2014/0374791 A1* | 12/2014 | Matsudai | H01L 29/404 257/139 |

FOREIGN PATENT DOCUMENTS

| | | |
|---|---|---|
| JP | H08-167715 A | 6/1996 |
| JP | 2007-266520 A | 10/2007 |
| JP | 2008-227236 A | 9/2008 |

OTHER PUBLICATIONS

Korean Office Action issued on Jan. 25, 2016 in corresponding Korean Application No. 10-2015-0008609, along with English translation thereof.

* cited by examiner

*Primary Examiner* — Michael Lebentritt
(74) *Attorney, Agent, or Firm* — White & Case LLP

(57) ABSTRACT

According to one embodiment, a semiconductor device includes a first semiconductor layer, a second semiconductor layer provided in a portion on the first semiconductor layer, a first insulating layer provided on the first semiconductor layer on a terminal region side of the second semiconductor layer, a third semiconductor layer provided on the first semiconductor layer on the terminal region side of the first insulating layer, a second insulating layer provided on the first semiconductor layer on the terminal region side of the third semiconductor layer, a fourth semiconductor layer provided between the first semiconductor layer and the second insulating layer, and a plurality of field plate electrodes provided inside an inter-layer insulating film, the plurality of field plate electrodes having mutually-different distances from the first semiconductor layer.

6 Claims, 8 Drawing Sheets

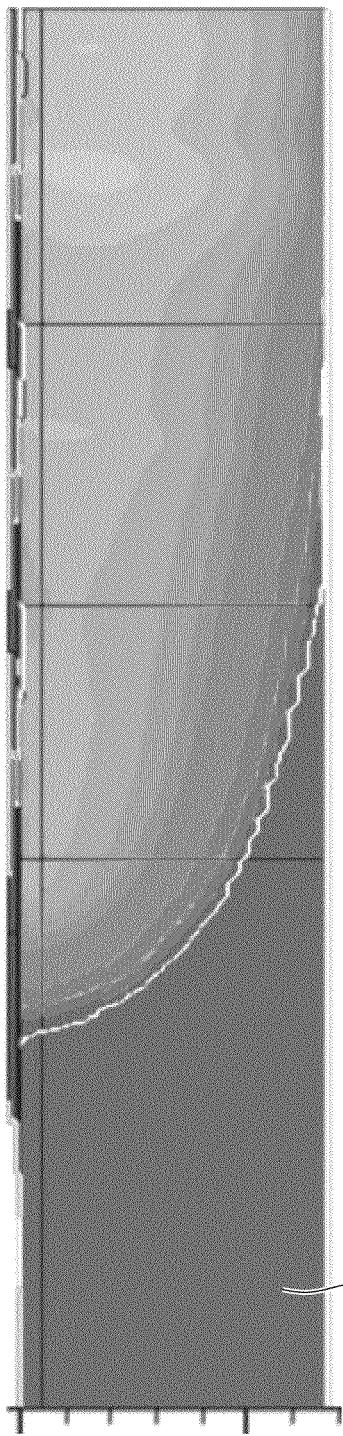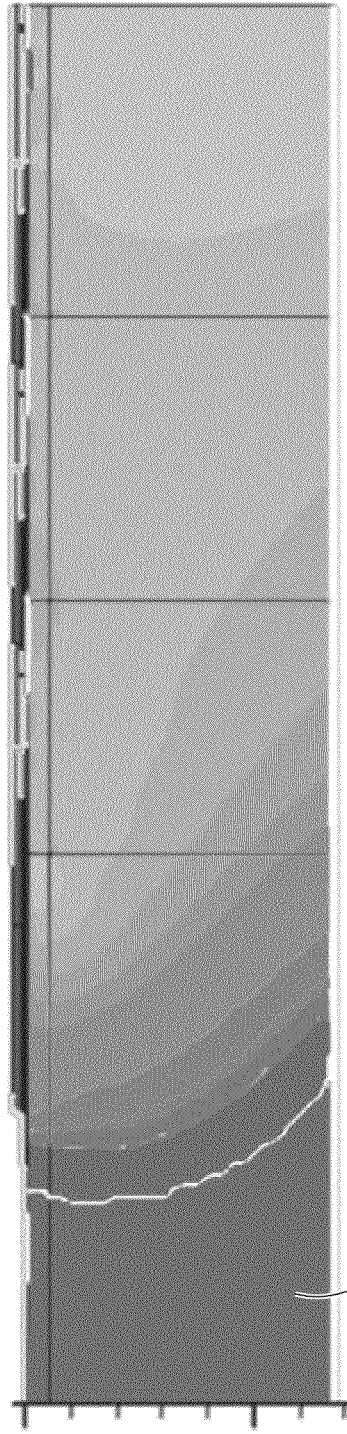
FIG. 6A
FIG. 6B

SEMICONDUCTOR DEVICE

CROSS-REFERENCE TO RELATED APPLICATIONS

This application is based upon and claims the benefit of priority from Japanese Patent Application No. 2014-158930, filed on Aug. 4, 2014; the entire contents of which are incorporated herein by reference.

FIELD

Embodiments described herein relate generally to a semiconductor device.

BACKGROUND

Power semiconductor elements such as IGBTs (Insulated Gate Bipolar Transistors), etc., are used in power electronics technology. In recent years, it is becoming desirable to use electrical energy even more efficiently, and the development of power electronics technology and power semiconductor elements is becoming even more important for highly-efficient power conversion. Low switching loss, high-speed operation, a wide area of safe operation, and a wider range of breakdown voltages are necessary for such power semiconductor elements.

Among these, the breakdown voltage is important for both the element edge terminal region and the element cell region which determines the breakdown voltage of the element itself. In the element edge terminal region, breakdown may occur due to a locally-high electric field due to the structure of the element edge terminal region. Therefore, the breakdown voltage design of the element edge terminal region also is important; and currently, structures have been proposed such as a VLD (Variation of Lateral Doping) structure, a RESURF structure, a guard ring structure, etc. Further, the reliability is important so that breakdown voltage fluctuation, leakage current increase, etc., do not occur even for the conditions of high temperatures and voltage applications for a long period of time.

BRIEF DESCRIPTION OF THE DRAWINGS

FIG. 6A is a view showing the semiconductor device according to the comparative example of the first embodiment and showing a spreading of a depletion layer in the case where a n-type drift layer has a low specific resistance; and FIG. 6B is a view showing according to the comparative example of the first embodiment and showing a spreading of the depletion layer in the case where the n-type drift layer has a high specific resistance;

DETAILED DESCRIPTION

In general, according to one embodiment, a semiconductor device includes a first semiconductor layer of a first conductivity type, a second semiconductor layer of a second conductivity type provided in a portion on the first semiconductor layer, a gate electrode provided inside the first semiconductor layer and the second semiconductor layer with a gate insulator film interposed between the gate electrode and the first semiconductor layer and between the gate electrode and the second semiconductor layer, a first insulating layer provided on the first semiconductor layer on a terminal region side of the second semiconductor layer, a third semiconductor layer of the second conductivity type provided on the first semiconductor layer on the terminal region side of the first insulating layer, a second insulating layer provided on the first semiconductor layer on the terminal region side of the third semiconductor layer, a fourth semiconductor layer of the first conductivity type provided between the first semiconductor layer and the second insulating layer, an inter-layer insulating film provided on the first semiconductor layer to contact the second semiconductor layer, the third semiconductor layer, the first insulating layer, and the second insulating layer, and a plurality of field plate electrodes provided inside the inter-layer insulating film, the plurality of field plate electrodes having mutually-different distances from the first semiconductor layer.

Embodiments of the invention will now be described with reference to the drawings. Although the first conductivity type is an n-type and the second conductivity type is a p-type in the description of the embodiments, it is possible to implement the embodiments in the case where the two are interchanged.

First, a semiconductor device of a first embodiment will be described.

Figure 1A:
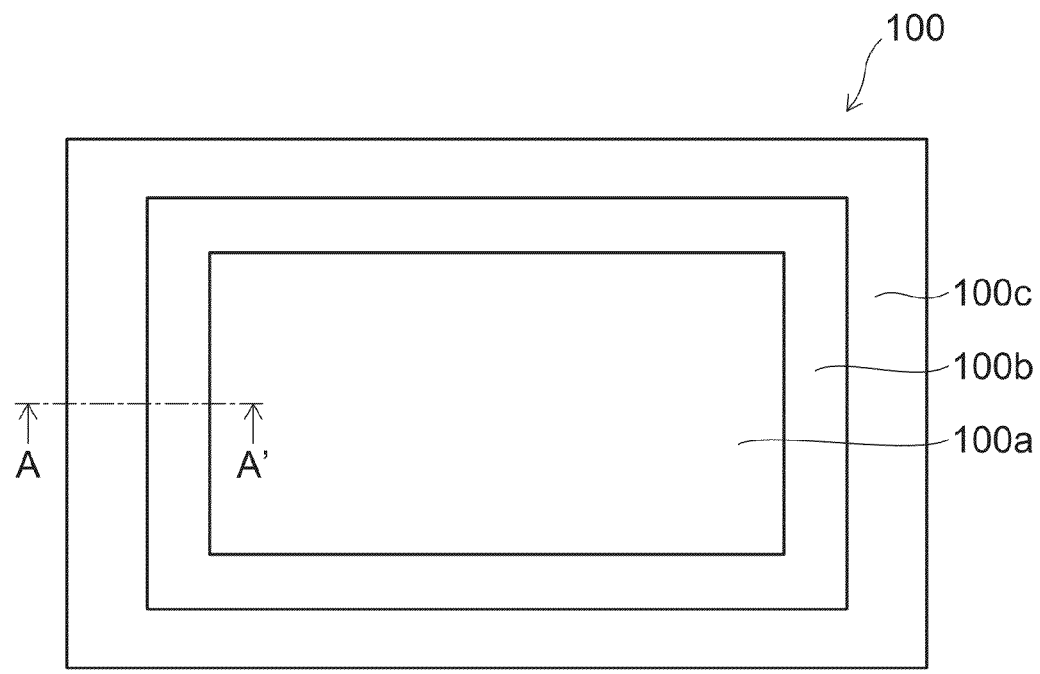
FIG. 1A is a plan view showing a semiconductor device according to a first embodiment.
Figure 1B:
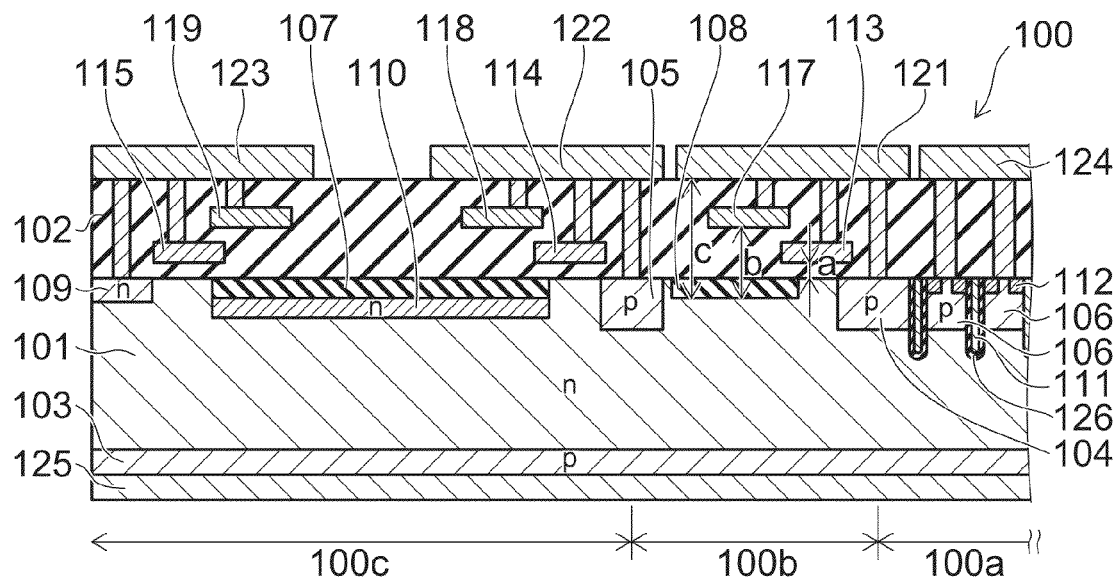
FIG. 1B is a cross-sectional view along line A-A' of FIG. 1A.

FIG. 1A is a plan view showing the semiconductor device 100 according to the embodiment; and FIG. 1B is a cross-sectional view along line A-A' of FIG. 1A.

As shown in FIG. 1A, a cell unit 100a is provided in the semiconductor device 100; and a first terminal region 100b and a second terminal region 100c are provided on the outer side of the cell unit 100a. In other words, the first terminal region 100b is provided around the cell unit 100a; and further, the second terminal region 100c is provided around the first terminal region 100b.

As shown in FIG. 1B, an n-type drift layer 101 (a first semiconductor layer) is provided in the semiconductor device 100 according to the embodiment; and an inter-layer insulating film 102 is provided to contact the upper surface of the n-type drift layer 101. A p-type collector layer 103 is provided on the side of the n-type drift layer 101 opposite to the surface where the inter-layer insulating film 102 is provided. A collector electrode 125 is provided under the p-type collector layer 103.

Although the direction from the n-type drift layer 101 toward the inter-layer insulating film 102 is referred to as "up" and the opposite direction is referred to as "down" for convenience in the specification, the directions are independent of the direction of gravity.

P-type guard ring layers 104 and 105 (second and third semiconductor layers), a p-type body layer 106, an insulating layer 107 (a second insulating layer), an insulating layer 108 (a first insulating layer), and an n-type region 109 are provided at the upper layer portion of the n-type drift layer 101. The p-type guard ring layer 105 is provided to straddle the boundary region between the first terminal region 100b and the second terminal region 100c; and the p-type guard ring layer 104 is provided to straddle the boundary region between the cell unit 100a and the first terminal region 100b. The p-type body layer 106 is multiply provided in the cell unit 100a. The p-type guard ring layers 104 and 105 (the second and third semiconductor layers) are provided to contact the lower surface of the inter-layer insulating film 102. The n-type region 109 is provided in the outermost peripheral section of the second terminal region 100c and contacts the lower surface of the inter-layer insulating film 102. The insulating layer 107 is provided on the n-type drift layer 101 to be positioned between the p-type guard ring layer 105 and the n-type region 109 in contact with the lower surface of the inter-layer insulating film 102. The insulating layer 107 is provided to be separated from the p-type guard ring layer 105 and the n-type region 109. An n-type semiconductor layer 110 is provided inside the n-type drift layer 101 at the lower surface of the insulating layer 107. The insulating layer 108 is provided on the n-type drift layer 101 to be positioned between the p-type guard ring layer 105 and the p-type guard ring layer 104 in contact with the lower surface of the inter-layer insulating film 102. The insulating layer 108 is provided to be separated from the p-type guard ring layer 105 and the p-type guard ring layer 104. The insulating layer 108 may be provided to contact the p-type guard ring layer 105.

The upper end of a gate electrode 111 contacts the inter-layer insulating film 102; the lower end of the gate electrode 111 is positioned inside the n-type drift layer 101; and the gate electrode 111 is provided between the adjacent p-type body layers 106. In the outermost peripheral section of the cell unit 100a, the gate electrode 111 is provided to be positioned between the p-type body layer 106 and the p-type guard ring layer 104. An n-type source layer 112 is provided between the upper portion of the p-type body layer 106 and the upper portion of the gate electrode 111 in contact with the upper portion of the p-type body layer 106 and the upper portion of the gate electrode 111; and the n-type source layer 112 also contacts the inter-layer insulating film 102. A gate insulator film 126 is provided between the gate electrode 111 and each of the n-type drift layer 101, the p-type body layer 106, the n-type source layer 112, and the inter-layer insulating film 102.

The n-type drift layer 101 is formed of, for example, silicon (Si), silicon carbide (SiC), gallium nitride (GaN), etc. The inter-layer insulating film 102 is formed of, for example, silicon oxide ($SiO_2$), PSG (Phosphorus Silicon Glass), BPSG (Boron Phosphorus Silicon Glass), TEOS (Tetra Ethyl Ortho Silicate), etc., formed by CVD (Chemical Vapor Deposition), thermal oxidation, or the like.

Field plate electrodes 113, 114, and 115 (first field plate electrodes) are provided to be flat inside the inter-layer insulating film 102. The field plate electrodes 113, 114, and 115 are separated from the n-type drift layer 101; and a portion of the inter-layer insulating film 102 is interposed between the n-type drift layer 101 and the field plate electrodes 113, 114, and 115. The field plate electrode 113 is positioned inside the first terminal region 100b; the field plate electrode 114 is positioned inside the second terminal region 100c; and the field plate electrode 115 is positioned inside the second terminal region 100c.

When viewed from above, the end portion of the field plate electrode 113 on the inner circumferential side overlaps the end portion of the p-type guard ring layer 104 on the outer circumferential side; and the end portion of the field plate electrode 113 on the outer circumferential side overlaps the end portion of the insulating layer 108 on the inner circumferential side.

When viewed from above, the end portion of the field plate electrode 114 on the inner circumferential side overlaps the end portion of the p-type guard ring layer 105 on the outer circumferential side; and the end portion of the field plate electrode 114 on the outer circumferential side overlaps the end portion of the insulating layer 107 on the inner circumferential side.

When viewed from above, the end portion of the field plate electrode 115 on the inner circumferential side overlaps the end portion of the insulating layer 107 on the outer circumferential side; and the end portion of the field plate electrode 115 on the outer circumferential side overlaps the end portion of the n-type region 109 on the inner circumferential side.

Field plate electrodes 117, 118, and 119 (second field plate electrodes) are provided to be flat inside the inter-layer insulating film 102. The field plate electrodes 117, 118, and 119 are isolated from the n-type drift layer 101; and a portion of the inter-layer insulating film 102 is interposed between the n-type drift layer 101 and the field plate electrodes 117, 118, and 119. The field plate electrode 117 is positioned inside the first terminal region 100b; and the field plate electrode 118 and the field plate electrode 115 are positioned inside the second terminal region 100c.

When viewed from above, the field plate electrode 117 overlaps a portion or the entirety of the insulating layer 108; and the end portion of the field plate electrode 117 on the inner circumferential side is provided to overlap the end portion of the field plate electrode 113 on the outer circumferential side.

When viewed from above, the field plate electrode 118 overlaps a portion or the entirety of the insulating layer 107; and the end portion of the field plate electrode 118 on the inner circumferential side overlaps the end portion of the field plate electrode 114 on the outer circumferential side.

When viewed from above, the field plate electrode 119 is provided to overlap a portion or the entirety of the insulating layer 107; and the end portion of the field plate electrode 119 on the outer circumferential side is provided to overlap the end portion of the field plate electrode 115 on the inner circumferential side.

Field plate electrodes 121, 122, and 123 (third field plate electrodes) are provided to be flat on the inter-layer insulating film 102. In other words, the field plate electrodes 121, 122, and 123 are isolated from the n-type drift layer 101 with the inter-layer insulating film 102 interposed between the n-type drift layer 101 and the field plate electrodes 121, 122, and 123. The field plate electrode 121 is positioned inside the first terminal region 100b; the field plate electrode 122 is positioned inside the first terminal region 100b and the second terminal region 100c; and the field plate electrode 123 is positioned inside the second terminal region 100c.

When viewed from above, the field plate electrode 121 overlaps the p-type guard ring layer 104, the field plate electrodes 113 and 114, and the insulating layer 108.

When viewed from above, the field plate electrode 122 overlaps the p-type guard ring layer 105, the field plate electrodes 114 and 118, and a portion of the insulating layer 107 on the inner circumferential side.

When viewed from above, the field plate electrode 123 overlaps a portion of the insulating layer 107 on the outer circumferential side, the field plate electrodes 119 and 115, and the n-type region 109.

A distance a is the shortest distance between the n-type drift layer 101 and the field plate electrodes 113, 114, and 115; a distance b is the shortest distance between the n-type drift layer 101 and the field plate electrodes 117, 118, and 119; a distance c is the shortest distance between the n-type drift layer 101 and the field plate electrodes 121, 122, and 123; the distance a is shorter than the distance b; and the distance b is shorter than the distance c.

The field plate electrodes 113, 114, and 115 may include, for example, polysilicon, etc. The field plate electrodes 117, 118, 119, 121, 122, and 123 may include, for example, a metal having a low resistance such as tungsten (W), copper (Cu), molybdenum (Mo), aluminum (Al), ruthenium (Ru), etc.

In the first terminal region 100b which is most proximal to the cell unit 100a, the p-type guard ring layer 104 and the field plate electrodes 113, 117, and 121 are connected to an emitter potential. At the outermost peripheral of the first terminal region 100b and the inner circumferential portion of the second terminal region 100c, the p-type guard ring layer 105 and the field plate electrodes 114, 118, and 122 are connected to each other. Thereby, the field plate electrodes 114, 118, and 122 are set to be in a floating state. In a region proximal to the outermost peripheral section of the second terminal region 100c, the n-type region 109 and the field plate electrodes 115, 119, and 123 are connected to each other and set to be in the floating state.

An emitter electrode 124 is provided on the inter-layer insulating film 102. The emitter electrode 124 is separated from the n-type drift layer 101; and a portion of the inter-layer insulating film 102 is interposed between the emitter electrode 124 and the n-type drift layer 101. When viewed from above, the emitter electrode 124 overlaps the p-type body layers 106, the gate electrode 111, and the n-type source layer 112. The emitter electrode 124 is connected to the p-type body layers 106 and the n-type source layer 112.

A method for manufacturing the semiconductor device 100 will now be described.

FIG. 2A to FIG. 4C are cross-sectional views of processes, showing the method for manufacturing the semiconductor device 100 according to the first embodiment and are cross sections corresponding to the cross section along line A-A' of FIG. 1A.

Figure 2A:
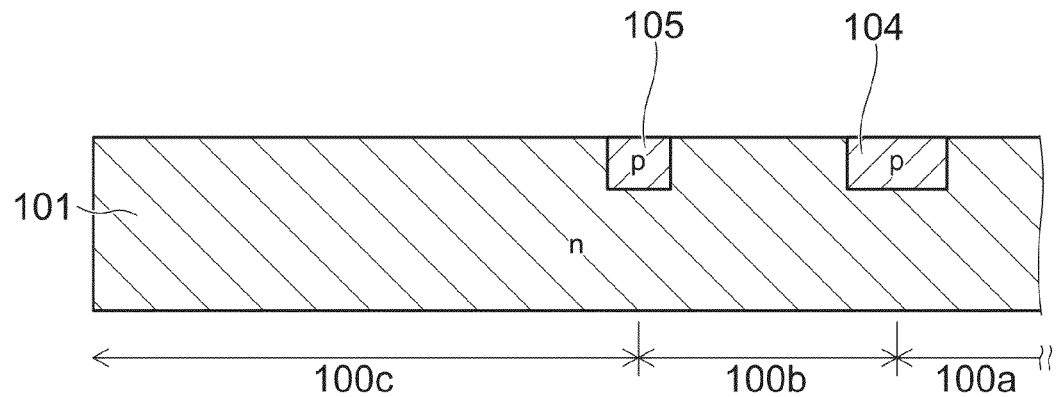
FIG. 2A to FIG. 2C are cross-sectional views of processes, showing a method for manufacturing the semiconductor device according to the first embodiment and are cross sections corresponding to the cross section along line A-A' of FIG. 1A.

First, as shown in FIG. 2A, the p-type guard ring layers 104 and 105 are formed in the upper layer portion of the n-type drift layer 101 by using a photoresist, etc., as a mask and by selectively performing ion implantation and thermal diffusion of an impurity used as an acceptor, e.g., boron (B) or the like. The p-type guard ring layer 104 is formed to straddle the boundary region between the cell unit 100a and the first terminal region 100b; and the p-type guard ring layer 105 is formed to straddle the boundary region between the first terminal region 100b and the second terminal region 100c.

Figure 2B:
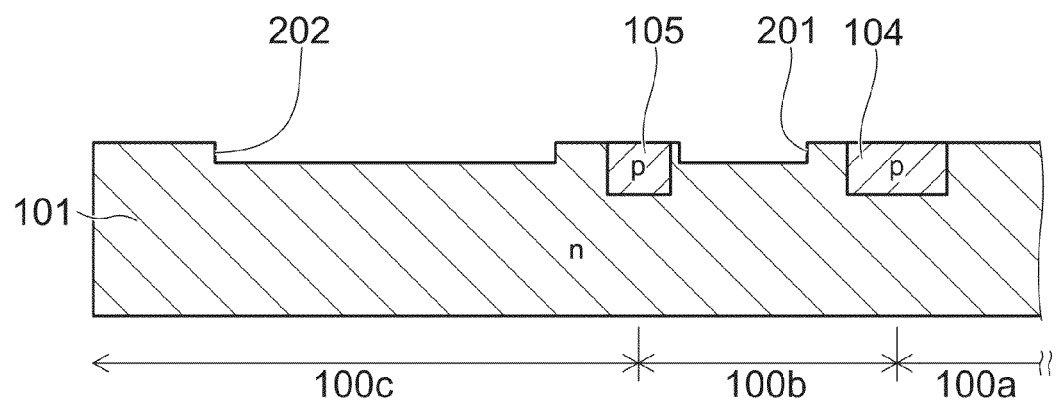

Then, as shown in FIG. 2B, trenches 201 and 202 are made in the upper surface of the n-type drift layer 101 in, for example, two locations. The trench 201 is formed between the p-type guard ring layer 104 and the p-type guard ring layer 105 to be separated from the p-type guard ring layer 104 and the p-type guard ring layer 105. The trench 202 is made between the p-type guard ring layer 105 and the portion where the n-type region 109 is to be formed in a process described below, i.e., the outermost peripheral section of the second terminal region 100c; and the trench 202 is made to be separated from the portion where the p-type guard ring layer 105 and the n-type region 109 are formed.

Figure 2C:
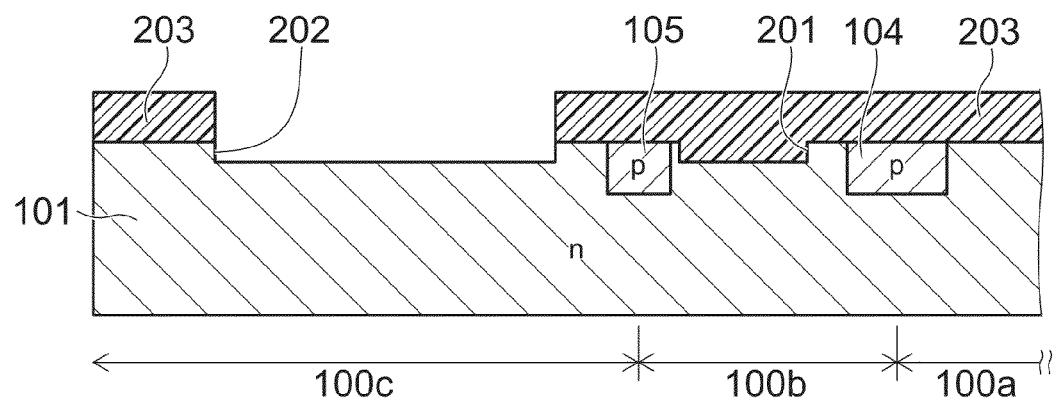

Then, as shown in FIG. 2C, the region of the upper surface of the n-type drift layer 101 other than the region where the trench 202 is made is covered with a mask 203 made of a photoresist, etc.; and ion implantation of an impurity used as a donor, e.g., phosphorus (P) or the like, is performed selectively. Subsequently, the mask 203 is removed.

Continuing, ion implantation of phosphorus (P), etc., may be performed selectively after selectively making the trench 202; and the trench 201 may be made after the ion implantation.

Figure 3A:
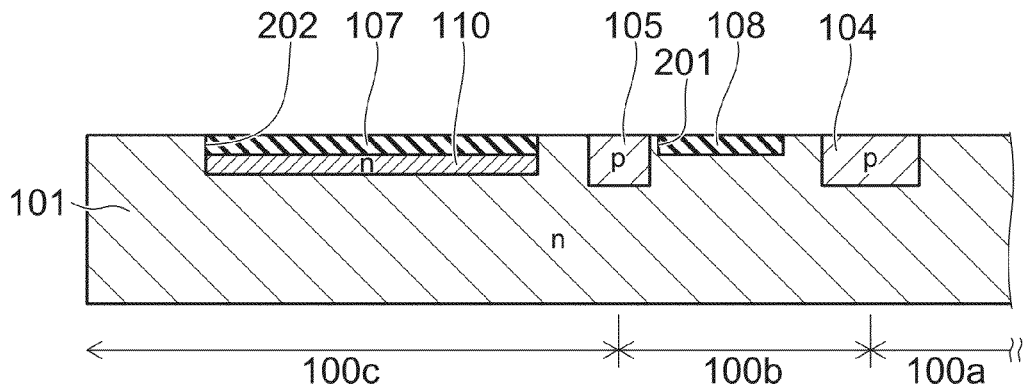
FIG. 3A to FIG. 3C are cross-sectional views of processes, showing the method for manufacturing the semiconductor device according to the first embodiment and are cross sections corresponding to the cross section along line A-A' of FIG. 1A.

Thereby, as shown in FIG. 3A, the n-type semiconductor layer 110 is formed in the region of the n-type drift layer 101 directly under the trench 202. Then, the insulating layers 107 and 108 are formed inside the trenches 201 and 202 by depositing, for example, silicon oxide by CVD (Chemical Vapor Deposition), etc.

Figure 3B:
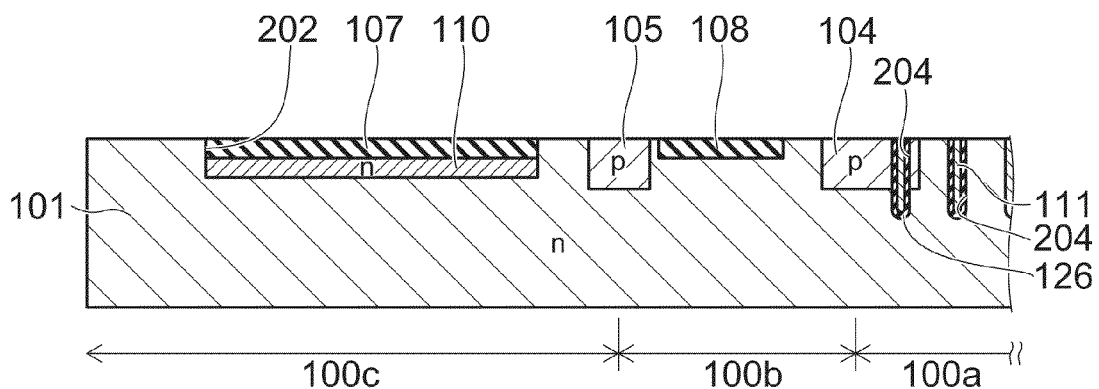

Then, as shown in FIG. 3B, multiple trenches 204 are made at any spacing in the cell unit 100a of the n-type drift layer 101. At least one trench 204 on the outermost peripheral side of the cell unit 100a pierces the end portion of the p-type guard ring layer 104 on the inner circumferential side and is made to reach the n-type drift layer 101. Then, the gate insulator film 126 is formed on the inner surface of the trench 204; and the gate electrode 111 is formed by filling polysilicon into the interior of the trench 204.

Continuing, a thin inter-layer insulating film 102a is formed using thermal oxidation, CVD, or the like, or a plurality of such methods; and a silicon deposition film is formed by depositing polysilicon, etc., on the inter-layer insulating film 102a. Subsequently, the silicon deposition film is selectively removed by forming a photoresist, etc., and performing RIE (Reactive Ion Etching), etc., using the photoresist as a mask so that the field plate electrodes 113, 114, and 115 remain at the desired positions. Thereby, the field plate electrodes 113, 114, and 115 are formed on the inter-layer insulating film 102a.

Figure 3C:
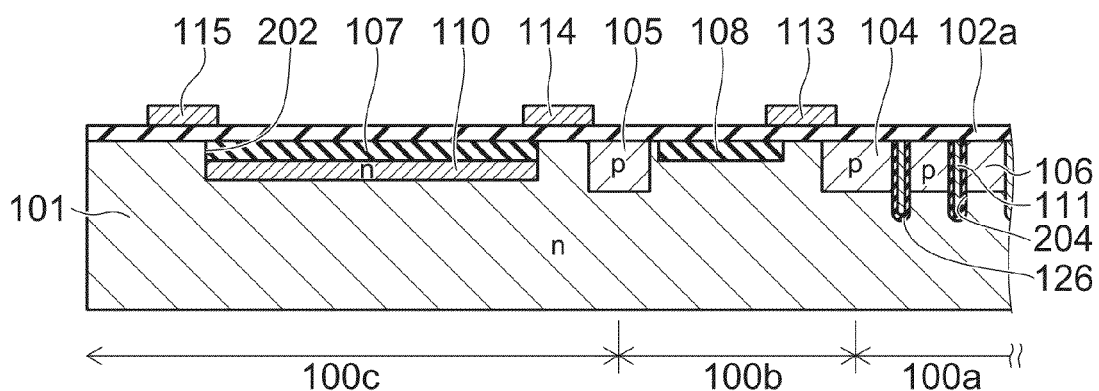

Then, as shown in FIG. 3C, the p-type body layer 106 is formed between the trenches 204.

For example, when viewed from above, the field plate electrode 113 is formed at a position so that the end portion of the field plate electrode 113 on the inner circumferential side overlaps the end portion of the p-type guard ring layer 104 on the outer circumferential side and the end portion of the field plate electrode 113 on the outer circumferential side overlaps the end portion of the insulating layer 108 on the inner circumferential side. When viewed from above, the field plate electrode 114 is formed at a position so that the end portion of the field plate electrode 114 on the inner circumferential side overlaps the end portion of the p-type guard ring layer 105 on the outer circumferential side and the end portion of the field plate electrode 114 on the outer circumferential side overlaps the end portion of the insulating layer 107 on the inner circumferential side. When viewed from above, the field plate electrode 115 is formed so that the end portion of the field plate electrode 115 on the inner circumferential side overlaps the end portion of the insulating layer 107 on the outer circumferential side and the end portion of the field plate electrode 115 on the outer circumferential side overlaps the n-type region 109 formed in the outermost peripheral section of the second terminal region 100c in a process described below.

The p-type body layer 106 may be formed prior to making the trenches 204.

Figure 4A:
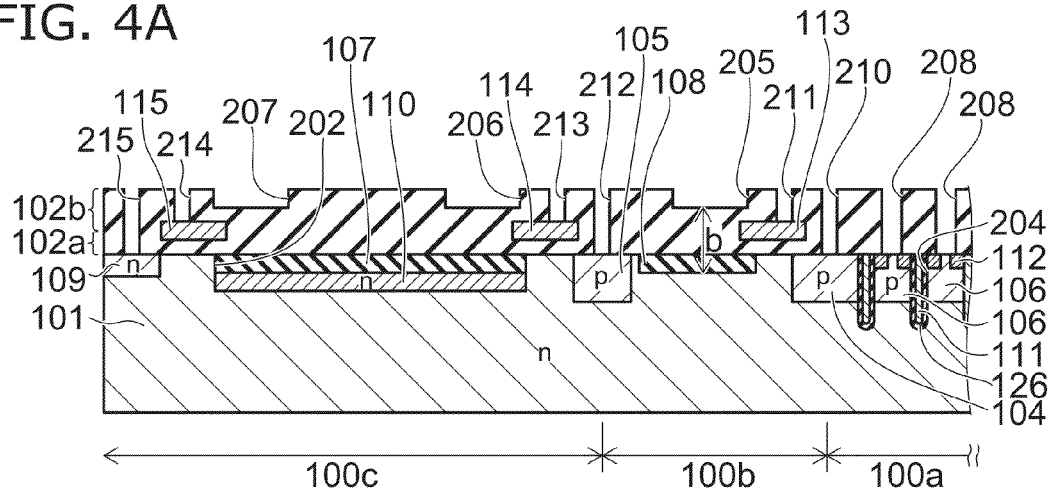
FIG. 4A to FIG. 4C are cross-sectional views of processes, showing the method for manufacturing the semiconductor device according to the first embodiment and are cross sections corresponding to the cross section along line A-A' of FIG. 1A.

Continuing as shown in FIG. 4A, the n-type region 109 and the n-type source layer 112 are formed by selectively performing ion implantation of an impurity used as a donor, e.g., phosphorus, arsenic (As), or the like. For example, the n-type region 109 is formed in the outermost peripheral section of the second terminal region 100c; and the n-type source layer 112 is formed to contact the upper portion of the p-type body layer 106 and the upper portion of the gate insulator film 126.

Then, an inter-layer insulating film 102b is formed by CVD, etc. Then, by RIE, etc., using a photoresist, etc., as a mask, trenches 205, 206, and 207 that are used to form the field plate electrodes 117, 118, and 119 in a subsequent process, through-holes 211, 213, and 214 that connect the field plate electrodes 113, 114, and 115 to the field plate electrodes 121, 122, and 123 formed in a process described below, through-holes 210, 212, and 215 that connect the p-type guard ring layers 104 and 105 and the n-type region 109 to the field plate electrodes 121, 122, and 123, and a through-hole 208 that connects the p-type body layer 106 to the emitter electrode 124 formed in a process 215 described below are made.

For example, when viewed from above, the trench 205 is made so that the trench 205 overlaps a portion of the insulating layer 108, and an end portion of the trench 205 on the inner circumferential side overlaps the end portion of the field plate electrode 113 on the outer circumferential side. For example, when viewed from above, the trench 206 is made so that the trench 206 overlaps a portion of the insulating layer 107, and the end portion of the trench 206 on the inner circumferential side overlaps the end portion of the field plate electrode 114 on the outer circumferential side. For example, when viewed from above, the trench 207 is made so that the trench 207 overlaps a portion of the insulating layer 107, and the end portion of the trench 207 on the outer circumferential side overlaps the end portion of the field plate electrode 115 on the outer circumferential side. At this time, the distance a is shorter than the distance b, where the distance a is the shortest distance between the n-type drift layer 101 and the field plate electrodes 113, 114, and 115, and the distance b is the shortest distance between the n-type drift layer 101 and the bottom surfaces of the trenches 205, 206, and 207.

The through-hole 208 is multiply made so that one through-hole 208 extends from the upper surface of the inter-layer insulating film 102b for one p-type body layer 106. The through-hole 210 is made to extend from the upper surface of the inter-layer insulating film 102b to reach the upper surface of the p-type guard ring layer 104. The through-hole 211 is made to extend from the upper surface of the inter-layer insulating film 102b to reach the upper surface of the field plate electrode 113. The through-hole 212 is made to extend from the upper surface of the inter-layer insulating layer 102b to reach the upper surface of the p-type guard ring layer 105. The through-hole 213 is made to extend from the upper surface of the inter-layer insulating film 102b to reach the upper surface of the field plate electrode 114. The through-hole 214 is made to extend from the upper surface of the inter-layer insulating film 102b to reach the upper surface of the field plate electrode 115. The through-hole 215 is made to extend from the upper surface of the inter-layer insulating film 102b to reach the upper surface of the n-type region 109.

Figure 4B:
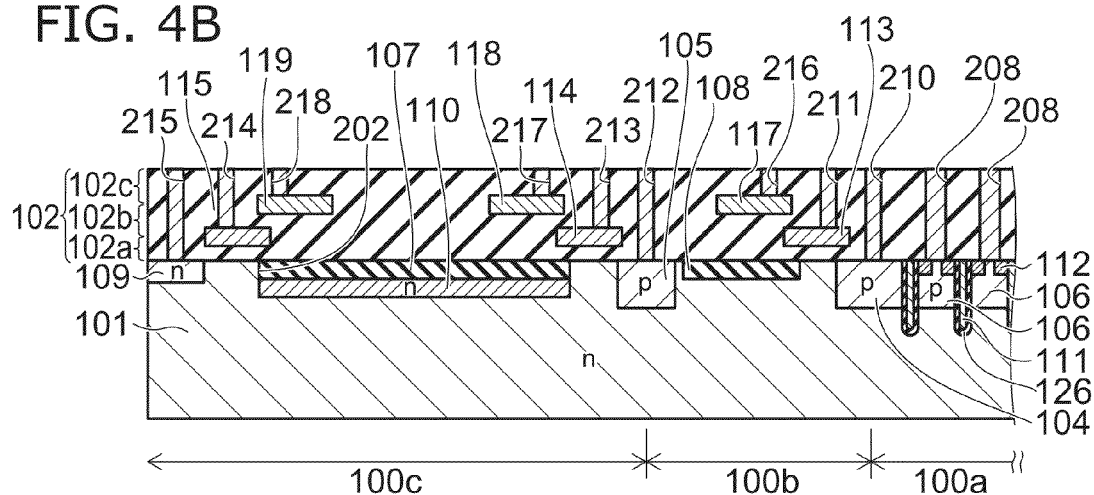

Then, as shown in FIG. 4B, the field plate electrodes 117, 118, and 119 are formed by filling a low-resistance metal into the trenches 205, 206, and 207 by CMP (Chemical Mechanical Polishing), etc., and by planarizing. At this time, the low-resistance metal is filled into each of the through-holes.

Then, an inter-layer insulating film 102c is formed by CVD, etc. The inter-layer insulating film 102 includes the inter-layer insulating films 102a, 102b, and 102c. Then, through-holes 216, 217, and 218 are made by RIE, etc., using a photoresist, etc., as a mask. The through-hole 216 is made to extend from the upper surface of the inter-layer insulating film 102 to reach the field plate electrode 117. The through-hole 217 is made to extend from the upper surface of the inter-layer insulating film 102 to reach the field plate electrode 118. The through-hole 119 extends from the upper surface of the inter-layer insulating film 102. The through-holes 208, 210, 211, 212, 213, 214, and 215 extend to reach the upper surface of the inter-layer insulating film 102c; and a low-resistance metal is filled into the extended through-holes.

Figure 4C:
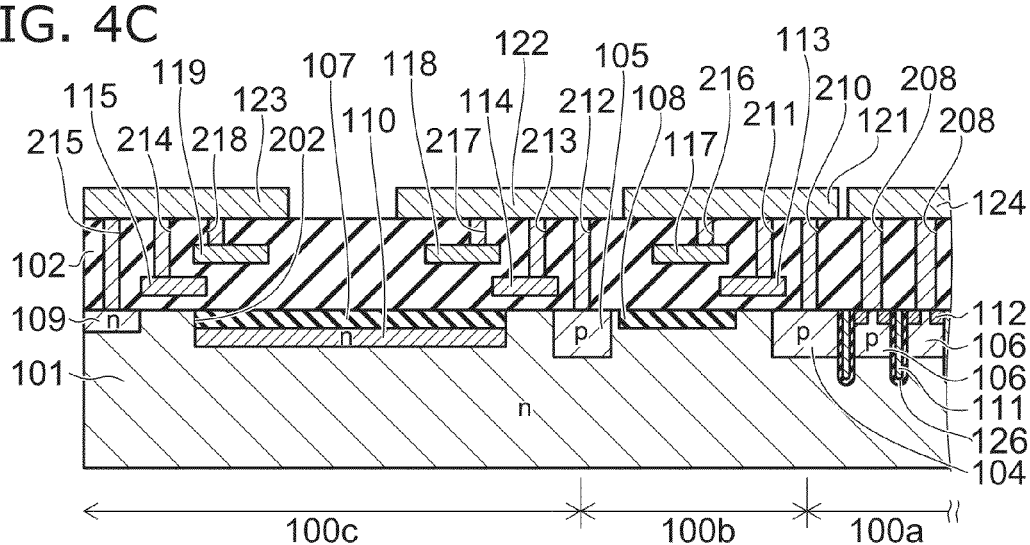

Continuing as shown in FIG. 4C, the field plate electrodes 121, 122, and 123 and the emitter electrode 124 are formed by depositing a metal material by sputtering, etc., and by performing selective etching by RIE, etc., using a photoresist, etc., as a mask. For example, when viewed from above, the field plate electrode 121 is formed to overlap the p-type guard ring layer 104, the field plate electrodes 113 and 117, and the insulating layer 108. For example, when viewed from above, the field plate electrode 122 is formed to overlap the p-type guard ring layer 105 and the field plate electrodes 114 and 118; and the field plate electrode 122 is formed so that the end portion of the field plate electrode 122 on the outer circumferential side overlaps the end portion of the insulating layer 107 on the inner circumferential side. For example, when viewed from above, the field plate electrode 123 is formed to overlap the n-type region 109 and the field plate electrodes 115 and 119; and the field plate electrode 123 is formed so that the end portion of the field plate electrode 123 on the inner circumferential side overlaps the end portion of the insulating layer 107 on the outer circumferential side. For example, when viewed from above, the emitter electrode 124 is formed to overlap the p-type body layer 106 and the gate electrode 111.

Thereby, the field plate electrode 121 is connected to the p-type guard ring layer 104 via the metal material inside the through-hole 210, connected to the field plate electrode 113 via the metal material inside the through-hole 211, and connected to the field plate electrode 117 via the metal material inside the through-hole 216. The field plate electrode 122 is connected to the p-type guard ring layer 105 via the metal material inside the through-hole 212, connected to the field plate electrode 114 via the metal material inside the through-hole 213, and connected to the field plate electrode 118 via the metal material inside the through-hole 217. The field plate electrode 123 is connected to the field plate electrode 119 via the metal material inside the through-hole 218, connected to the field plate electrode 115 via the metal material inside the through-hole 214, and connected to the n-type region 109 via the metal material inside the through-hole 215. The emitter electrode 124 is connected to the p-type body layer 106 via the metal material inside the through-hole 108.

Then, as shown in FIG. 1B, the lower layer portion of the n-type drift layer 101 is removed to thin the layer to a desired thickness; and the p-type collector layer 103 is formed in the lower surface of the n-type drift layer 101 by performing ion implantation of an impurity used as an acceptor, e.g., boron (B) or the like. The collector electrode 125 is formed under the p-type collector layer 103.

Here, an n-type buffer layer (not shown) may be formed with the p-type collector layer 103.

Thus, the semiconductor device 100 is manufactured by processes such as those shown in FIG. 2A to FIG. 4C.

The manufacturing method described above is merely an example; and implementation is possible using, for example, film formation methods other than CVD such as ALD (Atomic Layer Deposition) in which growth control of a single atomic layer is possible, vacuum vapor deposition, coating, spraying, etc.

Effects of the embodiment will now be described.

According to the embodiment, when a voltage having a reverse bias is applied to the semiconductor device 100 according to the embodiment, a depletion layer occurs from the starting points of the p-n junction interface between the n-type drift layer 101 and the p-type body layer 106 of the cell unit 100*a* and from the p-n junction interface between the n-type drift layer 101 and the p-type guard ring layer 104 of the first terminal region 100*b* connected to the emitter potential. The depletion layer spreads from the cell unit 100*a* into the first terminal region 100*b* toward the n-type drift layer 101 directly under the field plate electrode 113 connected to the emitter potential, directly under the field plate electrode 117, and directly under the field plate electrode 121. Further, the depletion layer spreads into the second terminal region 100*c* on the outer side of the first terminal region 100*b* and spreads from the first terminal region 100*b* into the second terminal region 100*c* toward the n-type drift layer 101 directly under the p-n junction interface between the n-type drift layer 101 and the p-type guard ring layer 105 set to be in the floating state and the field plate electrode 114, the field plate electrode 118, and the field plate electrode 122 set to be in the floating state.

In such a case, the potential gradient is gradual because the first terminal region 100*b* including the field plates connected to the emitter potential and the second terminal region 100*c* including the field plates set to be in the floating state are provided on the outer side of the cell unit 100*a* and because, for example, in the first terminal region 100*b*, the distance is sequentially increased for the distance a between the field plate electrode 113 and the n-type drift layer 101, the distance b between the field plate electrode 117 and the n-type drift layer 101, and the distance c between the field plate electrode 121 and the n-type drift layer 101. Also, by providing the n-type semiconductor layer 110 having a concentration that is higher than that of the n-type drift layer 101, the extension of the depletion layer to the outermost peripheral section when the reverse bias is applied is suppressed; and the element breakdown at the circumferential edge portion can be suppressed.

Particularly in the case where the n-type drift layer 101 is formed from a high specific resistance wafer, if the impurity concentration of the n-type drift layer 101 is low, the extension of the depletion layer increases when applying the voltage having the reverse bias. At this time, if the n-type semiconductor layer 110 is not provided, element breakdown may occur due to the depletion layer reaching the outermost peripheral section by the extension of the depletion layer being promoted in the second terminal region 100*c* where the field plate electrode partially does not exist. Conversely, according to the embodiment, even in the case where the high specific resistance wafer is used as the n-type drift layer 101, by providing the n-type semiconductor layer 110 having the impurity concentration higher than that of the n-type drift layer 101, the extension of the depletion layer into the outermost peripheral section when the reverse bias is applied is suppressed; and the element breakdown at the circumferential edge portion of the element can be suppressed.

As described above, according to the embodiment, it is possible to obtain a higher breakdown voltage at the terminal region.

Even in the case where the high specific resistance wafer is used as the n-type drift layer 101, by providing the n-type semiconductor layer 110 having a concentration higher than that of the n-type drift layer 101, the extension of the depletion layer into the outermost peripheral section when the reverse bias is applied is suppressed; and the element breakdown at the circumferential edge portion of the element can be suppressed.

In the case of a high breakdown voltage element, external charge is stored in the boundary between the substrate and the passivation films and/or oxide films formed on the element surface when manufacturing, etc. Due to the effects of the external charge, fluctuation of the electric field strength distribution of the depletion layer occurs easily in regions proximal to the substrate surface.

Therefore, by providing the n-type semiconductor layer 110 under the insulating layer 107, the position where the electric field concentrates is moved from the lower surface of the insulating layer 107 into the n-type semiconductor layer 110; and it is thereby possible to suppress the fluctuation of the breakdown voltage due to the effects of the external charge stored between the n-type drift layer 101 and the passivation film (not shown) and/or the inter-layer insulating film 102.

Further, by providing the field plate electrode 115, the field plate electrode 119, and the field plate electrode 123, the extension of the depletion layer in the outer circumferential direction is controlled; and the element breakdown at the circumferential edge portion can be suppressed. In other words, it is possible to increase the breakdown voltage for the entire element.

In the case where the field plates have stairstep configurations and are not flat, stepped portion breakage of the insulating layers and the field plate films occurs easily at the stepped portions, and there is a possibility of the field plates not being electrically connected; and therefore, it is necessary to set the insulating layers and the field plate films to be thick to avoid the stepped portion breakage. However, by multiply providing flat field plates, it is possible to reduce the thickness of the insulating layers and the field plate films without the stepped portion breakage of the films occurring; and it is possible to reduce the thickness of the entire element. Also, because the material may be different between the field plates for flat field plates, it is possible to have a wider material selection.

Comparative Example of First Embodiment

A comparative example of a first embodiment will now be described.

Figure 5:
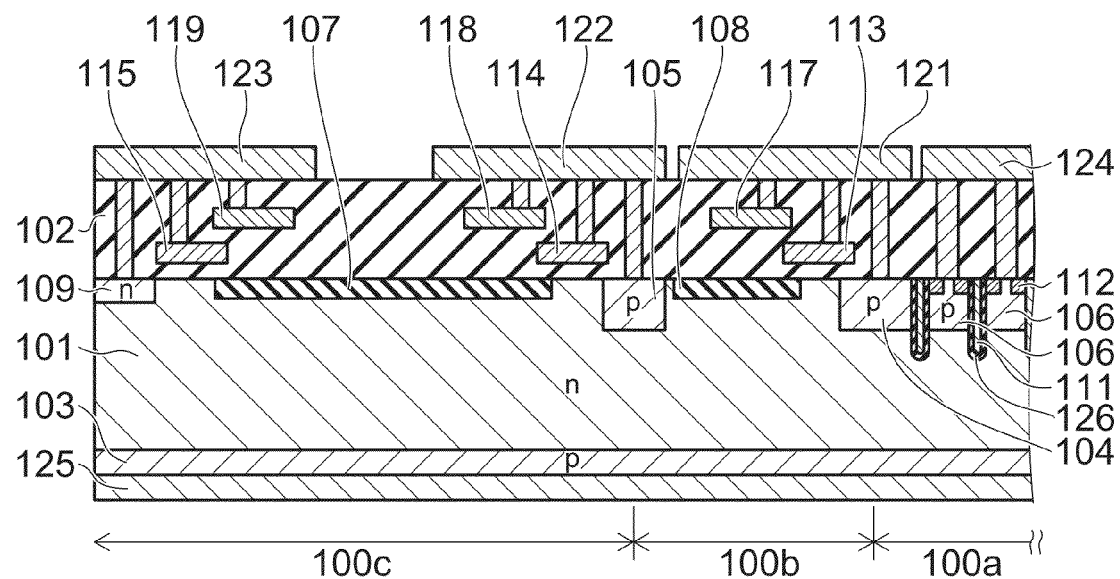
FIG. 5 is a cross-sectional view along line A-A' of FIG. 1A showing a semiconductor device according to a comparative example.

FIG. 5 is a cross-sectional view along line A-A' of FIG. 1A showing a semiconductor device according to the comparative example.

As shown in FIG. 5, an n-type semiconductor layer is not provided under the insulating layer 107 in the semiconductor device according to the comparative example. Other than the n-type semiconductor layer not being provided, the semiconductor device is similar to the semiconductor device 100 according to the first embodiment.

FIG. 6A is a cross section of the semiconductor device according to the comparative example corresponding to a cross section of the n-type drift layer, the n-type region, the insulating layer provided at the upper layer portion of the n-type drift layer, the p-type guard ring region, the gate electrode, and the p-type body layer and shows the spreading of the depletion layer when applying a voltage having a reverse bias to the semiconductor device in the case where the n-type drift layer has a low specific resistance; and FIG. 6B is a cross section of the semiconductor device according to the comparative example corresponding to a cross section of the n-type drift region, the n-type region, the insulating layer provided at the n-type drift layer upper layer, the p-type guard ring region, the gate electrode, and the p-type body layer and shows the spreading of the depletion layer when the voltage having the reverse bias is applied to the semiconductor device in the case where the n-type drift layer has a high specific resistance.

When the voltage having the reverse bias is applied as shown in FIG. 6A and FIG. 6B, the depletion layer extends into the outer circumferential portion more easily for the case where the n-type drift layer 101 has the high specific resistance than for the case where the n-type drift layer 101 has the low specific resistance. Accordingly, in the case where the n-type drift layer 101 that has the high specific resistance is used in the semiconductor device according to the comparative example, the electric field due to the depletion layer reaching the outer circumferential portion concentrates easily; and the breakdown voltage may undesirably decrease. Also, if the depletion layer extends too much, there is a risk of element breakdown caused by lattice defects of the outermost peripheral section, etc.

Second Embodiment

A second embodiment will now be described.

Figure 7:
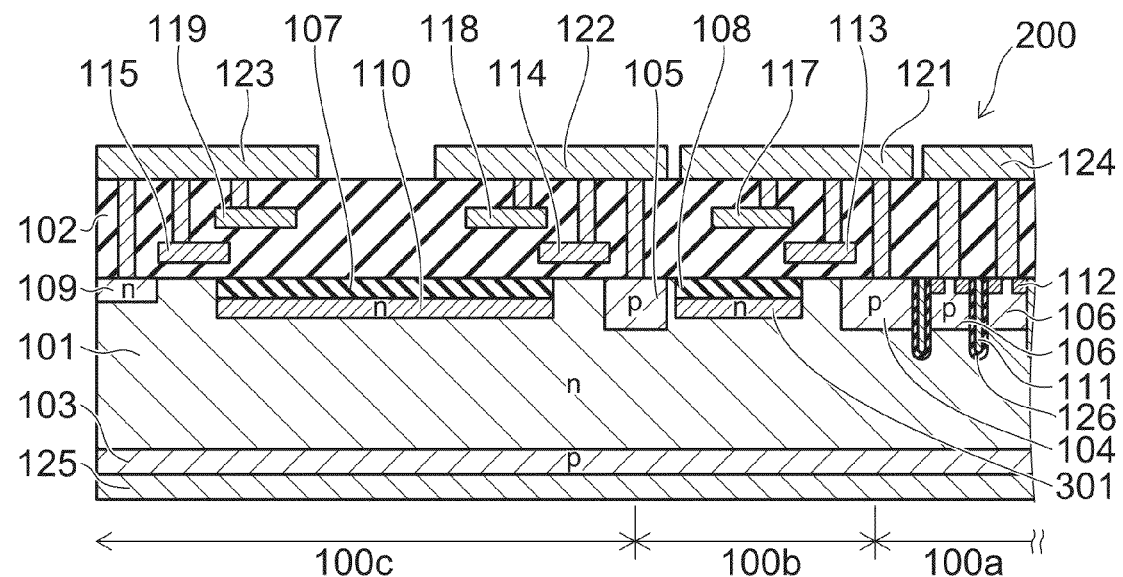
FIG. 7 is a cross-sectional view showing a semiconductor device according to a second embodiment.

FIG. 7 is a cross-sectional view showing a semiconductor device according to the second embodiment.

As shown in FIG. 7, an n-type semiconductor layer 301 is provided between the n-type drift layer 101 and the insulating layer 108 in the semiconductor device 200 according to the embodiment. The upper surface of the n-type semiconductor layer 301 contacts the insulating layer 108; and the lower surface and side surface of the n-type semiconductor layer 301 contact the n-type drift layer 101.

Other than the n-type semiconductor layer 301 being provided, the semiconductor device 200 is similar to the semiconductor device of the first embodiment.

Effects of the embodiment will now be described.

According to the embodiment, by providing the n-type semiconductor layer 301 also at the lower surface of the insulating layer 108, it is possible to suppress the fluctuation of the breakdown voltage due to the effects of the external charge in the first terminal region 100b as well.

Further, the n-type semiconductor layer 110 and the n-type semiconductor layer 301 can be formed simultaneously.

Third Embodiment

A third embodiment will now be described.

Figure 8:
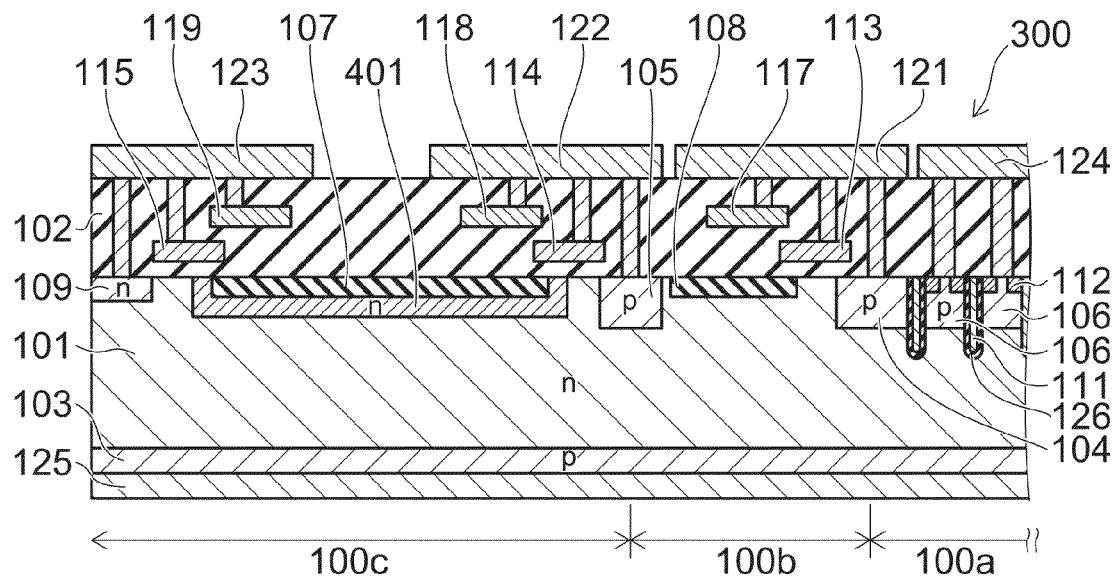
FIG. 8 is a cross-sectional view showing a semiconductor device according to a third embodiment.

FIG. 8 is a cross-sectional view showing a semiconductor device according to the third embodiment.

In the semiconductor device 300 according to the embodiment as shown in FIG. 8, a deep n-type semiconductor layer 401 is provided between the n-type region 109 and the p-type guard ring layer 105 in the second terminal region 100c and is separated from the n-type region 109 and the p-type guard ring layer 105. The n-type semiconductor layer 401 is formed as a diffusion layer that is wider than the n-type semiconductor layer 110 formed in the first embodiment; and the n-type semiconductor layer 401 covers the entire lower surface and side surface of the insulating layer 107.

Otherwise, the semiconductor device 300 is similar to the semiconductor device of the first embodiment.

Effects of the embodiment will now be described.

In the embodiment, first, the n-type semiconductor layer 401 is formed as a deep diffusion layer in a region that is wider than the region where the insulating layer 107 is disposed. Then, the insulating layer 107 is formed on the n-type semiconductor layer 401. At this time, the alignment when forming the insulating layer 107 is easy because the n-type semiconductor layer 401 is formed in a region that is wider than the region where the insulating layer 107 is disposed.

Fourth Embodiment

A fourth embodiment will now be described.

Figure 9:
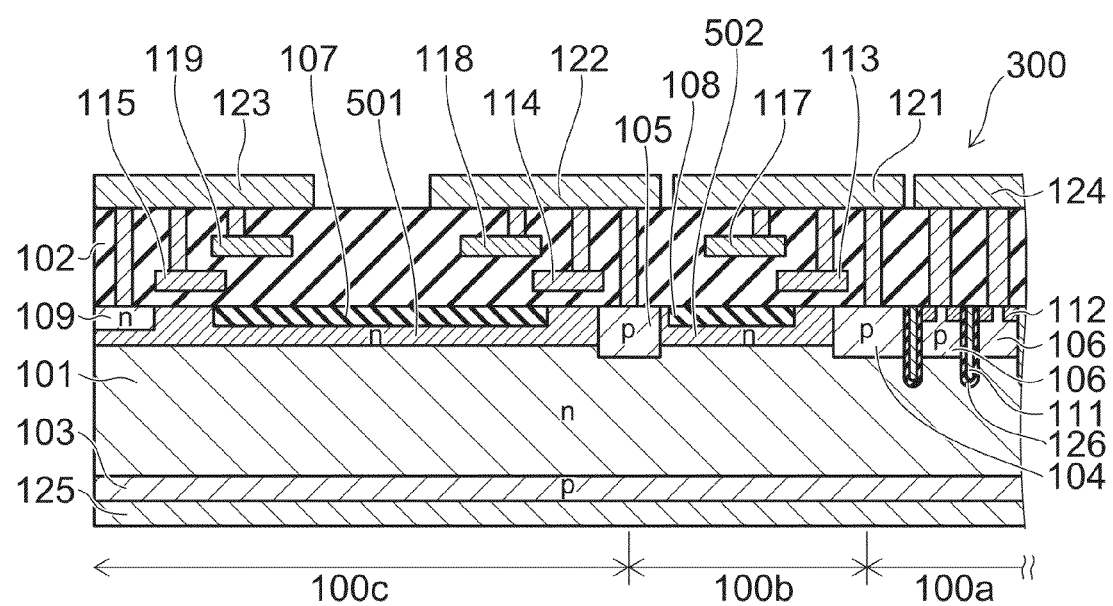
FIG. 9 is a cross-sectional view showing a semiconductor device according to a fourth embodiment.

FIG. 9 is a cross-sectional view showing a semiconductor device according to the fourth embodiment.

In the semiconductor device 400 according to the embodiment as shown in FIG. 9, n-type semiconductor layers 501 and 502 are provided at substantially the entire surface of the upper surface of the n-type drift layer 101 in the first terminal region 100b and the second terminal region 100c. The n-type semiconductor layers 501 and 502 are formed by, for example, epitaxial growth.

Otherwise, the semiconductor device 400 is similar to the semiconductor device of the first embodiment.

Effects of the embodiment will now be described.

According to the embodiment, it is possible to form the n-type semiconductor layers 501 and 502 and the second insulating layer 108 without making the trenches in the n-type drift layer 101. Also, the insulating layer 107 can be formed without making the trench in the second terminal region 100c.

Also, it is easy to dispose the insulating layer 107 and the insulating layer 108 on the n-type semiconductor layers 501 and 502.

According to the embodiments described above, a semiconductor device having a terminal structure having a high breakdown voltage can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor device, comprising:
    a first semiconductor layer of a first conductivity type;
    a second semiconductor layer of a second conductivity type provided in a portion on the first semiconductor layer;
    a gate electrode provided inside the first semiconductor layer and the second semiconductor layer with a gate insulator film interposed between the gate electrode and the first semiconductor layer and between the gate electrode and the second semiconductor layer;
    a first insulating layer provided on the first semiconductor layer on a terminal region side of the second semiconductor layer;
    a third semiconductor layer of the second conductivity type provided on the first semiconductor layer on the terminal region side of the first insulating layer;

a second insulating layer provided on the first semiconductor layer on the terminal region side of the third semiconductor layer;

a fourth semiconductor layer of the first conductivity type provided between the first semiconductor layer and the second insulating layer;

an inter-layer insulating film provided on the first semiconductor layer to contact the second semiconductor layer, the third semiconductor layer, the first insulating layer, and the second insulating layer; and a plurality of field plate electrodes provided inside the inter-layer insulating film, the plurality of field plate electrodes having mutually-different distances from the first semiconductor layer.

2. The device according to claim 1, further comprising a fifth semiconductor layer of the first conductivity type provided between the first semiconductor layer and the first insulating layer.

3. The device according to claim 1, wherein the fourth semiconductor layer covers the surfaces of the second insulating layer other than an upper surface of the second insulating layer.

4. The device according to claim 1, further comprising a fourth semiconductor layer of the first conductivity type provided on the first semiconductor layer on the terminal region side of the fourth semiconductor layer.

5. A semiconductor device, comprising:

a first semiconductor layer of a first conductivity type;

a second semiconductor layer of a second conductivity type provided in a portion on the first semiconductor layer;

a gate electrode piercing the second semiconductor layer, a lower end of the gate electrode entering the first semiconductor layer;

a gate insulator film provided between the gate electrode and the first semiconductor layer and between the gate electrode and the second semiconductor layer;

a fourth semiconductor layer of the first conductivity type provided on the first semiconductor layer on a terminal region side of the second semiconductor layer;

a third semiconductor layer of the second conductivity type provided on the first semiconductor layer on the terminal region side of the fourth semiconductor layer;

a fifth semiconductor layer of the first conductivity type provided on the first semiconductor layer on the terminal region side of the third semiconductor layer;

a first insulating layer provided on the fourth semiconductor layer;

a second insulating layer provided on the fifth semiconductor layer;

an inter-layer insulating film provided on the first semiconductor layer to contact the second semiconductor layer, the third semiconductor layer, the fourth semiconductor layer, the fifth semiconductor layer, the first insulating layer, and the second insulating layer; and a plurality of field plate electrodes provided inside the inter-layer insulating film, the plurality of field plate electrodes having mutually-different distances from the first semiconductor layer.

6. The device according to claim 5, wherein the fourth semiconductor layer and the fifth semiconductor layer are formed by epitaxial growth.

* * * * *